United States Patent
Sugiyama et al.

(10) Patent No.: US 7,678,514 B2
(45) Date of Patent: Mar. 16, 2010

(54) POSITIVE-TYPE PHOTOSENSITIVE RESIN COMPOSITION, CURED FILM, PROTECTING FILM, INSULATING FILM AND SEMICONDUCTOR DEVICE AND DISPLAY DEVICE USING THESE FILMS

(75) Inventors: Hiromichi Sugiyama, Shinagawa-ku (JP); Toshio Banba, Shinagawa-ku (JP); Shusaku Okamyo, Shinagawa-ku (JP)

(73) Assignee: Sumitomo Bakelite Co., Ltd., Tokyo (JP)

( * ) Notice: Subject to any disclaimer, the term of this patent is extended or adjusted under 35 U.S.C. 154(b) by 0 days.

(21) Appl. No.: 12/343,983

(22) Filed: Dec. 24, 2008

(65) Prior Publication Data

US 2009/0170026 A1 Jul. 2, 2009

(30) Foreign Application Priority Data

Dec. 27, 2007 (JP) ............................. 2007-335975
Apr. 1, 2008 (JP) ............................. 2008-094632

(51) Int. Cl.
*G03F 7/023* (2006.01)
*G03F 7/30* (2006.01)

(52) U.S. Cl. .................... 430/18; 430/191; 430/192; 430/193; 430/326; 430/330

(58) Field of Classification Search ................. 430/18, 430/191, 192, 193, 326
See application file for complete search history.

(56) References Cited

U.S. PATENT DOCUMENTS

| 6,071,666 | A  | * | 6/2000 | Hirano et al. | 430/191 |
| 6,235,436 | B1 | * | 5/2001 | Hirano et al. | 430/18 |
| 7,297,452 | B2 | * | 11/2007 | Lee et al. | 430/18 |
| 7,338,737 | B2 | * | 3/2008 | Lee et al. | 430/18 |
| 2006/0165574 | A1 | * | 7/2006 | Sayari | 423/210 |

FOREIGN PATENT DOCUMENTS

JP 56-27140 3/1981

* cited by examiner

*Primary Examiner*—John S Chu
(74) *Attorney, Agent, or Firm*—Oblon, Spivak, McClelland, Maier & Neustadt, L.L.P.

(57) ABSTRACT

A positive-type photosensitive resin composition that exhibits excellent adhesion to a substrate after a humidification treatment includes (A) an alkali-soluble resin, (B) a photosensitive diazoquinone compound, and (C-1) a silicon compound shown by the following formula (1),

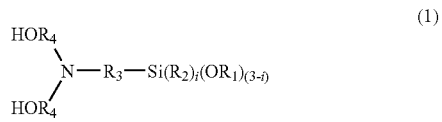

(1)

wherein $R_1$ and $R_2$ represent alkyl groups having 1 to 10 carbon atoms, $R_3$ represents an organic group, and $R_4$ represents an alkylene group having 1 to 10 carbon atoms, and i represents an integer from 0 to 2.

12 Claims, No Drawings

POSITIVE-TYPE PHOTOSENSITIVE RESIN COMPOSITION, CURED FILM, PROTECTING FILM, INSULATING FILM AND SEMICONDUCTOR DEVICE AND DISPLAY DEVICE USING THESE FILMS

BACKGROUND OF THE INVENTION

1. Field of the Invention

The present invention relates to a positive-type photosensitive resin composition, a cured film, a protecting film, an insulating film, a semiconductor device, and a display device using the films.

2. Description of Related Art

A polyimide resin having excellent heat resistance, superior electrical and mechanical properties, and the like has generally been used as a surface protecting film and an interlayer dielectric in semiconductor devices. In recent years, a polybenzoxazole resin which is regarded as having good moisture resistance reliability due to the absence of a carbonyl group that has high polarity and is derived from an imide ring has been used, and a photosensitive resin composition which can simplify a part of a relief pattern formation process due to photosensitivity is under development.

Nowadays, in order to further improve the photosensitive resins in terms of safety, a positive-type photosensitive resin composition which comprises a polybenzoxazole precursor which can be developed by an alkaline aqueous solution and a diazoquinone compound as a sensitizer has been developed (see JP-A-56-27140). Production of a relief pattern will now be described by way of a development mechanism of the positive-type photosensitive resin composition. Irradiation of (exposure to) actinic rays through a mask using a photolithographic device such as a stepper produces exposed areas and unexposed areas in a coated film on a wafer. The diazoquinone compound in the unexposed areas is insoluble in an alkaline aqueous solution, and provided with further resistance to the alkaline aqueous solution as a result of the interaction with the resin. On the other hand, the diazoquinone compound which is present in the exposed areas chemically changes by the action of the actinic rays and becomes soluble in an alkaline aqueous solution, thereby promoting dissolution of the resin. A relief pattern consisting only of the unexposed areas can be prepared by dissolving and removing the exposed area utilizing the solubility difference of the exposed areas and unexposed areas.

However, since the cured film produced from the photosensitive resin composition disclosed in JP-A-56-27140 has only poor adhesion to a substrate such as a silicon wafer, the film causes problems such as peeling after high temperature and high humidity treatment.

SUMMARY OF THE INVENTION

The present invention has been achieved in view of the above situation and has an object of providing a positive-type photosensitive resin composition, a cured film, a protecting film, and an insulating film exhibiting excellent adhesion to a substrate such as a silicon wafer after high temperature and high humidity treatment., as well as a semiconductor device and a display device using these films.

Another object of the present invention is to provide a positive-type photosensitive resin composition, a cured film, a protecting film, and an insulating film exhibiting excellent tensile elongation, as well as a semiconductor device and a display device using these films.

According to the present invention, these objects can be attained by the following [1] to [12].

[1] A positive-type photosensitive resin composition comprising (A) an alkali-soluble resin, (B) a photosensitive diazoquinone compound, and (C-1) a silicon compound shown by the following formula (1),

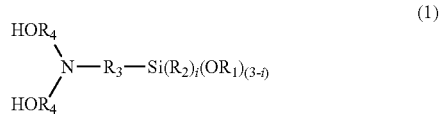

wherein $R_1$ and $R_2$ represent an alkyl group having 1 to 10 carbon atoms, $R_3$ represents an organic group, $R_4$ represents an alkylene group having 1 to 10 carbon atoms, and i represents an integer from 0 to 2.

[2] The positive-type photosensitive resin composition according to [1], wherein the alkali-soluble resin (A) comprises a polyamide resin having structural units (2-1) and (2-2) respectively shown by the following formulas (2-1) and (2-2),

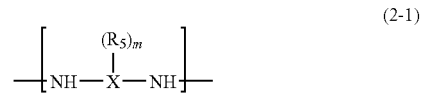

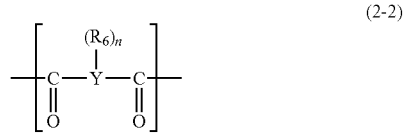

wherein X and Y are organic groups, $R_5$ represents a hydroxyl group, —O—$R_7$—, an alkyl group, an acyloxy group, or a cycloalkyl group, if there are two or more $R_5$s, the $R_5$s may be either the same or different, $R_6$ represents a hydroxyl group, a carboxyl group, —O—$R_7$, or —COO—$R_7$, if there are two or more $R_6$s, the $R_6$s may be either the same or different, m represents an integer from 0 to 8, n represents an integer from 0 to 8, and $R_7$ represents an organic group having 1 to 15 carbon atoms, when none of the $R_5$s is a hydroxyl group, at least one of the $R_6$s is a carboxyl group, and when none of the $R_6$s is a carboxyl group, at least one of the $R_5$s is a hydroxyl group.

[3] The positive-type photosensitive resin composition according to [2], wherein X—$(R_5)_m$ in the formula (2-1) is at least one group selected from groups shown by the following formula (3),

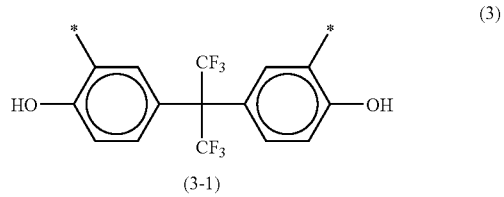

(3-1)

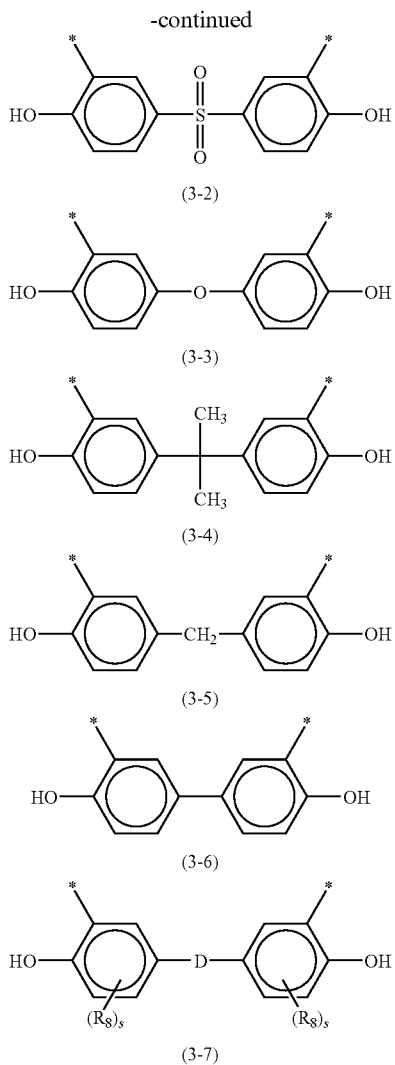

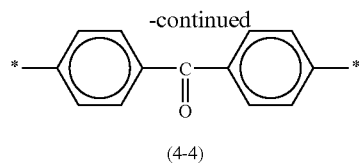

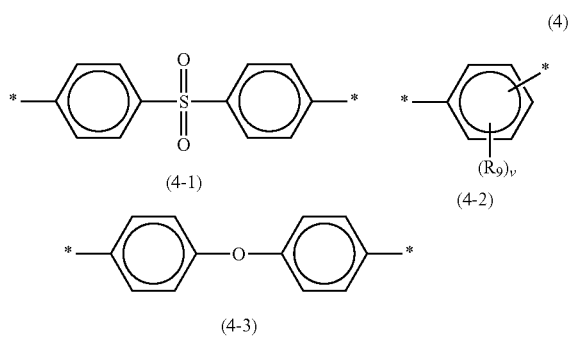

wherein the asterisks (*) bonds —NH group, D in the formula (3-7) represents —CH$_2$—, —CH(CH$_3$)—, —C(CH$_3$)$_2$—, —O—, —S—, —SO$_2$—, —CO—, —NHCO—, —C(CF$_3$)$_2$—, or a single bond, R$_8$ in the formula (3-7) represents an alkyl group, an alkoxy group, an acyloxy group or a cycloalkyl group, if there are two or more R$_8$s, the R$_8$s may be either the same or different, and s represents an integer from 1 to 3, wherein the asterisks (*) bonds —C=O group, R$_9$ is an alkyl group, an alkyl ester group, an alkyl ether group, a benzyl ether group, or a halogen atom, and if there are two or more R$_9$s, the R$_9$s may be either the same or different, and v represents an integer from 0 to 4.

[4] The positive-type photosensitive resin composition according to any one of [1] to [3], wherein i in the formula (1) showing the silicon compound (C-1) is 0.

[5] The positive-type photosensitive resin composition according to any one of [1] to [4], wherein R$_1$ in the formula (1) showing the silicon compound (C-1) is a methyl group or an ethyl group.

[6] The positive-type photosensitive resin composition according to any one of [1] to [5], wherein R$_4$ in the formula (1) showing the silicon compound (C-1) is a methylene group or an ethylene group.

[7] The positive-type photosensitive resin composition according to any one of [1] to [6], containing the silicon compound (C-1) shown by the formula (1) in an amount of 0.1 to 20 parts by weight for 100 parts by weight of the alkali-soluble resin (A).

[8] A cured film comprising a cured product of the positive-type photosensitive resin composition according to any one of [1] to [7].

[9] A protecting film comprising the cured film according to [8].

[10] An insulating film comprising the cured film according to [8].

[11] A semiconductor device comprising the cured film according to [8].

[12] A display device comprising the cured film according to [8].

According to the present invention, a positive-type photosensitive resin composition, a cured film, a protecting film, and an insulating film exhibiting excellent adhesion to a substrate such as a silicon wafer after high temperature and high humidity treatment., as well as a semiconductor device and a display device using these films can be provided.

In addition, a positive-type photosensitive resin composition, a cured film, a protecting film, and an insulating film exhibiting excellent tensile elongation, as well as a semiconductor device and a display device using these films can be provided by the present invention.

DETAILED DESCRIPTION OF THE INVENTION AND PREFERRED EMBODIMENTS

Preferred embodiments of the positive-type photosensitive resin composition, the cured film, the protecting film, the insulating film, the semiconductor device, and the display device of the present invention, and each component of the positive-type photosensitive resin composition are described in detail below. The embodiments are shown as examples and are not intended to limit the present invention.

The positive-type photosensitive resin composition of the present invention comprises (A) an alkali-soluble resin, (B) a photosensitive diazoquinone compound, and (C-1) a silicon compound shown by the following formula (1).

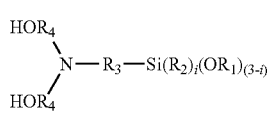

(1)

wherein $R_1$ and $R_2$ represent alkyl groups having 1 to 10 carbon atoms, $R_3$ represents an organic group, and $R_4$ represents an alkylene group having 1 to 10 carbon atoms, and i represents an integer from 0 to 2. $R_1$ and $R_2$ may be either the same or different Although not particularly limited, examples of the alkali-soluble resin (A) used in the positive-type photosensitive resin composition of the present invention include a cresol novolac resin, a hydroxystyrene resin, an acrylic resin such as a methacrylic acid resin and a methacrylate resin, a cycloolefin resin containing a hydroxyl group, a carboxyl group, or the like, and a polyamide resin. These resins may be used either individually or in combination of two or more. Among these, a polyamide resin is preferable due to excellent heat resistance and mechanical properties. Specific examples include a resin having at least one of the polybenzoxazole structure and polyimide structure and having a hydroxyl group, a carboxyl group, an ether group, or an ester group in the main chain or a side chain, a resin having a polybenzoxazole precursor structure, a resin having a polyimide precursor structure, and a resin having a polyamide acid ester structure. These resins may be used either individually or in combination of two or more.

As the polyamide resin used as the alkali-soluble resin (A), a polyamide resin obtained by the polymerization of a diamine component and an acid component by amide bonding and having the structural unit (2-1) as a structural unit derived from a diamine component and the structural unit (2-2) as a structural unit derived from an acid component can be given. Such a polyamide resin is hereinafter referred to from time to time as "polyamide resin having the structural unit (2-1) and the structural unit (2-2)".

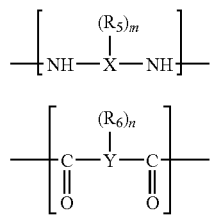

(2-1)

(2-2)

In the structural unit (2-1), X represents an organic group. $R_5$ represents a hydroxyl group, —O—$R_7$, an alkyl group, an acyloxy group, or a cycloalkyl group. The alkyl group, the acyloxy group, or the cycloalkyl group represented by $R_5$ has preferably 1 to 6 carbon atoms. m represents an integer from 0 to 8. $R_7$ represents an organic group having 1 to 15 carbon atoms. When two or more $R_5$s are present, the $R_5$s may be either the same or different.

In the structural unit (2-2), Y is an organic group. $R_6$ represents a hydroxyl group, a carboxyl group, —O—$R_7$, or —COO—$R_7$. n represents an integer from 0 to 8. $R_7$ represents an organic group having 1 to 15 carbon atoms. When two or more $R_6$s are present, the $R_6$s may be either the same or different.

From the viewpoint of mechanical characteristics and moisture resistance reliability, the polyamide resins containing the structural unit (2-1) in an amount of 30 to 100 mol % of all the structural units originating from the diamine components in the resin and the structural unit (2-2) in an amount of 30 to 100 mol % of all the structural units originating from the acid components in the resin are preferable among the polyamide resins having the structural unit (2-1) and the structural unit (2-2). A particularly preferable polyamide resin contains the structural unit (2-1) in an amount of 50 to 100 mol % of all the structural units originating from the diamine components in the resin and the structural unit (2-2) in an amount of 50 to 100 mol % of all the structural units originating from the acid components in the resin.

As examples of the organic group represented by X in the structural unit (2-1), an aromatic group having the structure of a benzene ring, a naphthalene ring, or the like, a bisphenol structure, a heterocyclic group such as a pyrrole structure, a furan structure, or the like, a siloxane structure, and the like can be given. Among these structures, the structures shown by the following formula (5) are preferable. These structures may be used either individually or in combination of two or more, as required.

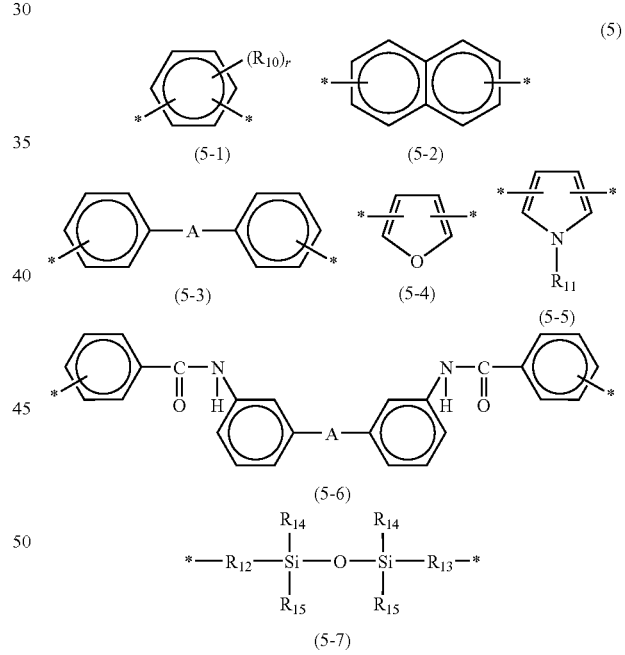

In the formula (5), the asterisk (*) bonds —NH group. A in the formula indicates —$CH_2$—, —$CH(CH_3)$—, —$C(CH_3)_2$—, —O—, —S—, —$SO_2$—, —CO—, —NHCO—, —$C(CF_3)_2$—, or a single bond. $R_{10}$ is an alkyl group, an alkyl ester group, or a halogen atom, and if there are two or more $R_{10}$s, the $R_{10}$s may be either the same or different. $R_{11}$ represents an alkyl group, an alkoxy group, an acyloxy group, or a cycloalkyl group. $R_{12}$ to $R_{15}$ represent an organic group. For example, $R_{12}$ and $R_{13}$ are alkylene groups having 1 to 3 carbon atoms, and $R_{14}$ and $R_{15}$ are alkyl groups having 1 or 2 carbon atoms.

As shown in the structural unit (2-1), X has 0 to 8 $R_5$s bonded thereto. These $R_5$s are omitted in the structures shown in the formula (5).

In the structural unit (2-1), as the partial structure shown by the following partial structural formula (I),

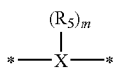
(I)

the structures shown by the following formula (6) are preferable from the viewpoint of excellent heat resistance and mechanical characteristics.

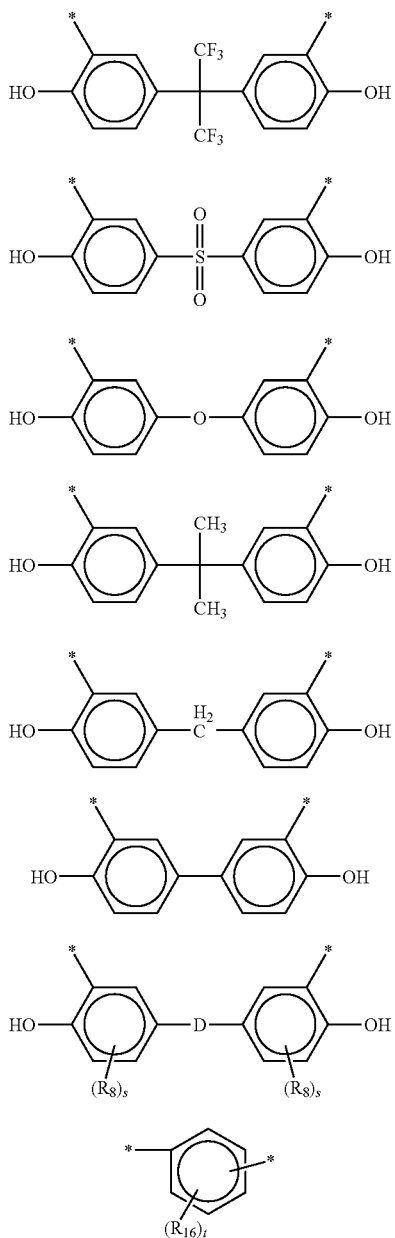

(6)

The —OH in the formulas (6-1), (6-2), (6-3), (6-4), (6-5), (6-6), (6-7), and (6-18) corresponds to the group (—$R_5$) in the formula (1). In the formula (6), the asterisk (*) bonds —NH group. D indicates —$CH_2$—, —$CH(CH_3)$—, —$C(CH_3)_2$—, —O—, —S—, —$SO_2$—, —CO—, —NHCO—, —C$(CF_3)_2$—, or a single bond. $R_8$ represents an alkyl group, an alkoxy group, an acyloxy group or a cycloalkyl group, if there are two or more $R_8$s, the $R_8$s may be either the same or different. The alkyl group, the alkoxy group, the acyloxy group, or the cycloalkyl group represented by $R_8$ preferably has 1 to 6 carbon atoms. $R_{16}$ s an alkyl group, an alkyl ester group, or a halogen atom, and if there are two or more $R_{16}$s, the $R_{16}$s may be either the same or different. The alkyl group or the alkyl ester group represented by $R_{16}$ preferably has 1 to 6 carbon atoms. s represents an integer from 1 to 3 and t represents an integer from 0 to 4.

Among as the structural unit (2-1) in the structures shown by the above formula (6), as the partial structure shown by the following partial structural formula (I),

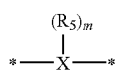

(I)

the structures shown by the following formula (3) are particularly preferable.

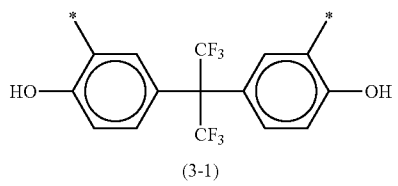

(3-1)

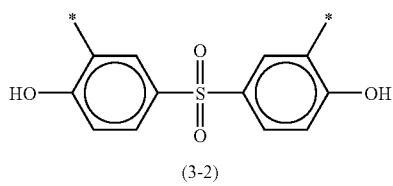

(3-2)

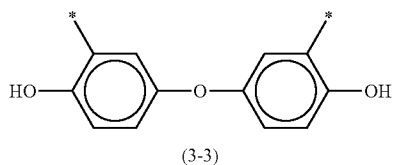

(3-3)

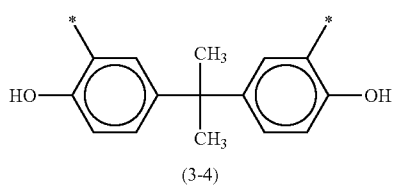

(3-4)

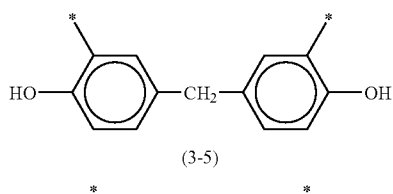

(3-5)

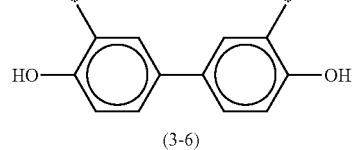

(3-6)

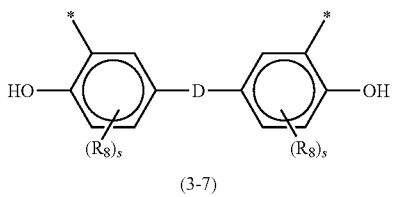

(3-7)

When the partial structural formula (I) in the polyamide resin having the structural unit (2-1) and the structural unit (2-2) is any one of the structures or a combination of the structures in the formula (3), the resulting positive-type photosensitive resin composition exhibits high adhesion to a substrate after hygrothermal treatment due to the combination of these structures with the silicon compound (C-1) shown by the above formula (1). The —OH in the formulas (3-1), (3-2), (3-3), (3-4), (3-5), (3-6), and (3-7) corresponds to the group ($—R_5$) in the formula (I).

In the formula (3), the asterisk (*) bonds —NH group. D in the formula (3-7) corresponds to —$CH_2$—, —$CH(CH_3)$—, —$C(CH_3)_2$—, —O—, —S—, —$SO_2$—, —CO—, —NHCO—, —$C(CF_3)_2$—, or a single bond. $R_8$ represents an alkyl group, an alkoxy group, an acyloxy group, or a cycloalkyl group. If there are two or more $R_8$s, the $R_8$s may be either the same or different. The alkyl group, the alkoxy group, the acyloxy group, or the cycloalkyl group represented by $R_8$ preferably has 1 to 6 carbon atoms. s represents an integer from 1 to 3.

As X, the above structures may be used either individually or in combination of two or more.

Y in the structural unit (2-2) is an organic group. The same structural units as the X in the structural unit (2-1) can be given as examples. Preferable examples include an aromatic group having a structure of a benzene ring, a naphthalene ring, or the like, a bisphenol structure, a heterocyclic group such as a pyrrole structure, a pyridine structure, a furan structure, or the like, a siloxane structure, and the like. Among these structures, the structures shown by the following formula (7) are preferable. These structural units may be used either individually or in combination of two or more.

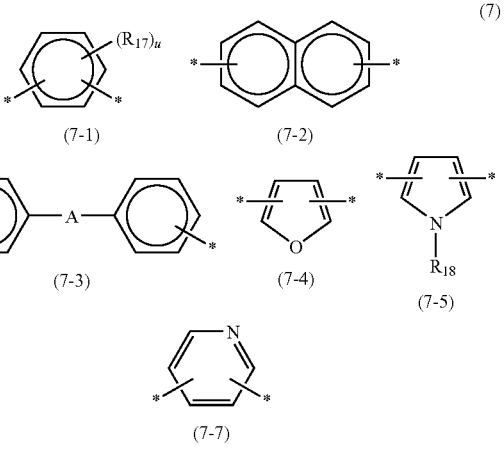

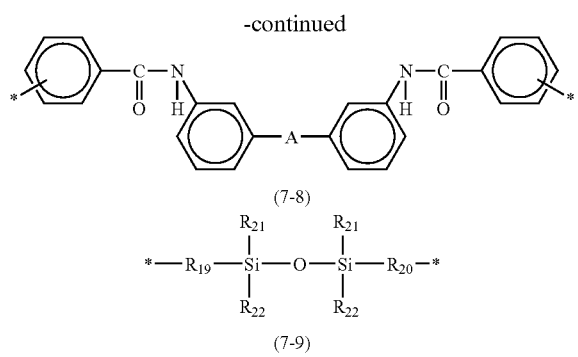

(7-8)

(7-9)

A in the formula indicates —CH$_2$—, —C(CH$_3$)$_2$—, —O—, —S—, —SO$_2$—, —CO—, —NHCO—, —C(CF$_3$)$_2$—, or a single bond. R$_{17}$ is an alkyl group, an alkyl ester group, or a halogen atom, and if there are two or more R$_{17}$s, the R$_{17}$s may be either the same or different. R$_{18}$ represents an alkyl group, an alkoxy group, an acyloxy group, or a cycloalkyl group. R$_{19}$ to R$_{22}$ represent an organic group. For example, R$_{19}$ and R$_{20}$ are alkylene groups having 1 to 3 carbon atoms, and R$_{21}$ and R$_{22}$ are alkyl groups having 1 or 2 carbon atoms. u represents an integer from 0 to 4.

As shown in the structural unit (2-2), Y has 0 to 8 R$_6$s bonded thereto. These R$_6$s are omitted in the structures shown in the formula (7).

In the structural unit (2-2), as the structure shown by the following partial structural formula (II),

the structures shown by the following formulas (8) and (9) are preferable due to excellent heat resistance and mechanical characteristics.

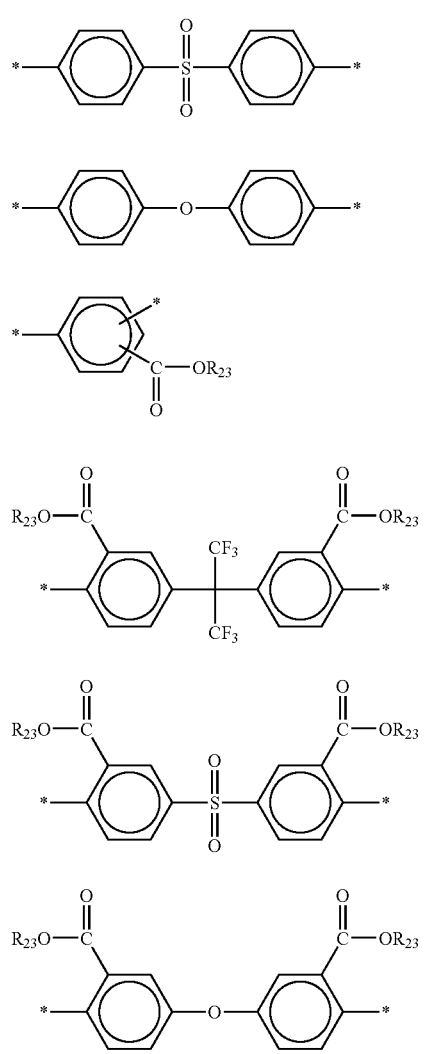

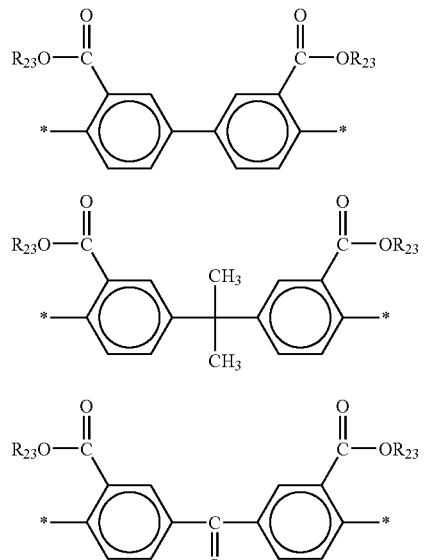
-continued
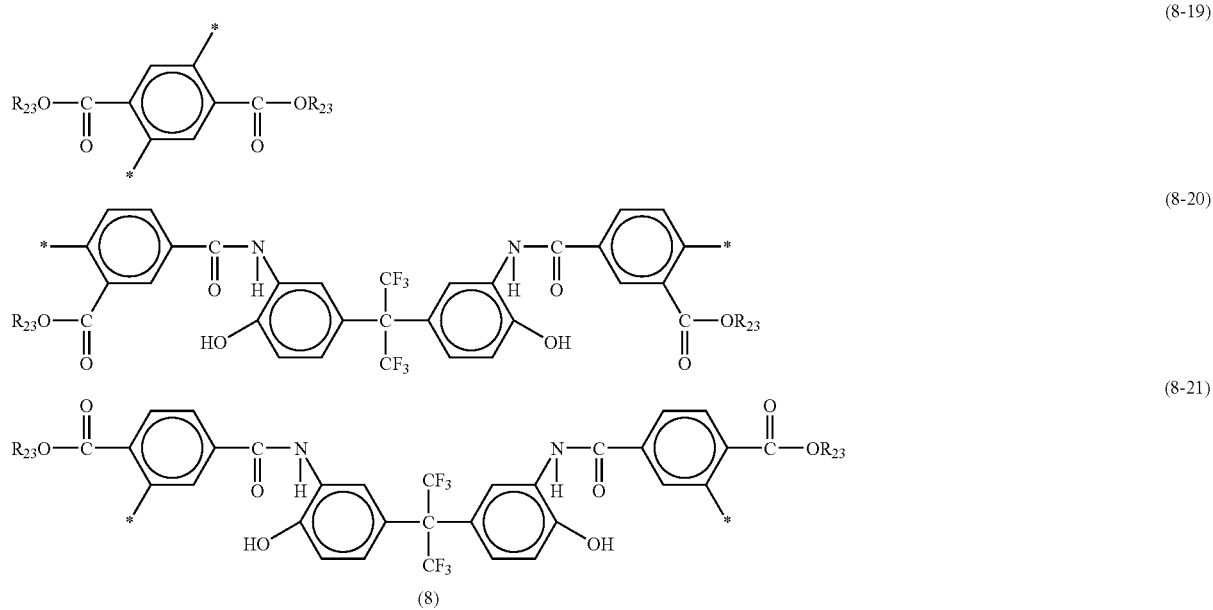
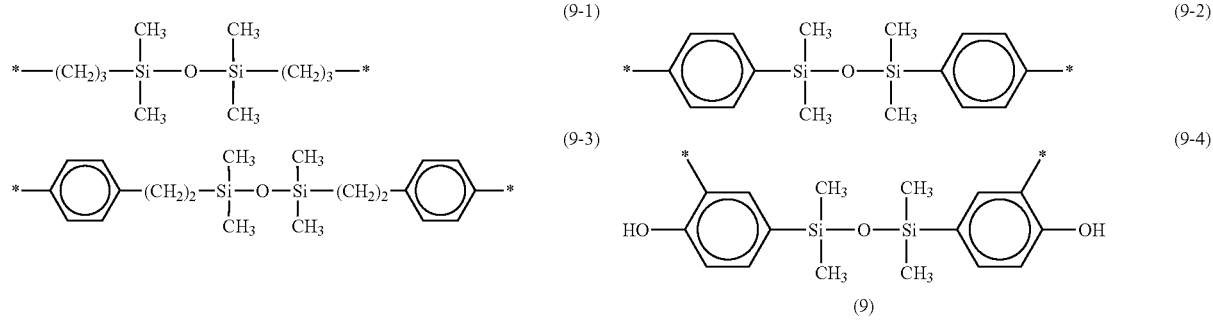
In the formulas (8) and (9), the asterisk (*) bonds —C═O. The —COOR$_{23}$ in the formulas (8-5), (8-6), (8-7), (8-8), (8-9), (8-10), (8-11), (8-12), (8-13), (8-14), (8-15), (8-16), (8-17), (8-18), (8-19), (8-20), and (8-21) corresponds to the group (—R$_6$) in the formula (II). The OH group in the formula (9-4) corresponds to (—R$_6$) in the formula (II).

As the structure originating from tetracarboxylic dianhydride in the formula (8), although those in which the both positions bonding to the C=O group are meta-positions and those in which the both positions bonding to the C=O group are para-positions are given, the structure may include those in which one of the positions is a meta-position and the other is a para-position.

$R_9$ is an alkyl group, an alkyl ester group, an alkyl ether group, a benzyl ether group, or a halogen atom, and if there are two or more $R_9$s, the $R_9$s may be either the same or different. The alkyl group, the alkyl ester group, the alkyl ether group, and the benzyl ether group represented by $R_9$ preferably has 1 to 10 carbon atoms. $R_{23}$ is a hydrogen atom or an organic group having 1 to 15 carbon atoms, such as an alkyl group of a branched alkyl group, of which a part may be substituted. v represents an integer from 0 to 4.

In the structural unit (2-2), as the structure shown by the following partial structural formula (II),

(II)

among the structures shown in the formulas (8) and (9), the structures shown in the formula (4) are particularly preferable. When the partial structural formula (II) in the polyamide resin having the structural unit (2-1) and the structural unit (2-2) is any one of the structures or a combination of the structures in the formula (4), the resulting positive-type photosensitive resin composition exhibits high adhesion to a substrate after hygrothermal treatment due to the combination of these structures with the silicon compound (C-1) shown by the formula (1).

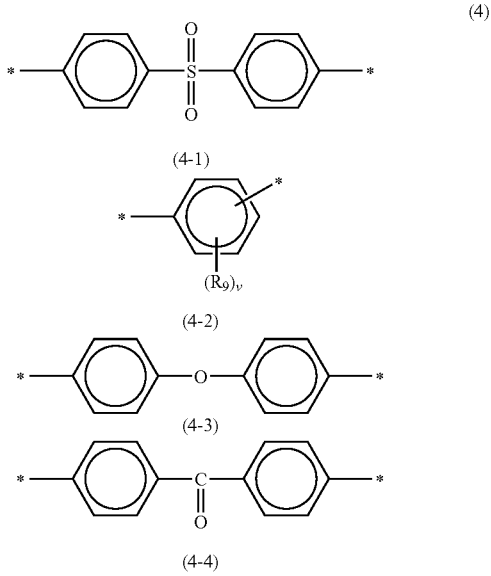

(4)

(4-1)

(4-2)

(4-3)

(4-4)

wherein the asterisk (*) bonds —C=O. $R_9$ is an alkyl group, an alkyl ester group, an alkyl ether group, a benzyl ether group, or a halogen atom, and if there are two or more $R_9$s, the $R_9$s may be either the same or different. The alkyl group, the alkyl ester group, the alkyl ether group, and the benzyl ether group represented by $R_9$ preferably has 1 to 10 carbon atoms. v represents an integer from 0 to 4.

In the polyamide resin having the structural unit (2-1) and the structural unit (2-2), when none of the $R_5$s in the structural unit (2-1) is a hydroxyl group, at least one of the $R_6$s in the structural unit (2-2) must be a carboxyl group. When none of the $R_6$s in the structural unit (2-2) is a carboxyl group, at least one of the $R_5$s in the structural unit (2-1) must be a hydroxyl group.

In the polyamide resin having the structural unit (2-1) and the structural unit (2-2), —O—$R_7$ as the substituent of X, and —O—$R_7$ and —COO—$R_7$ as the substituent of Y are groups in which a hydroxyl group or a carboxyl group is protected by $R_7$ which is an organic group having 1 to 15 carbon-atoms so as to adjust the solubility of the hydroxyl group or carboxyl group in an alkaline aqueous solution. The hydroxyl group or the carboxyl group may be protected, as required. As examples of $R_7$, a formyl group, a methyl group, an ethyl group, a propyl group, an isopropyl, a tert-butyl group, a tert-butoxycarbonyl group, a phenyl group, a benzyl group, a tetrahydrofuranyl group, a tetrahydropyranyl group, and the like can be given.

The polyamide resin having the structural unit (2-1) and the structural unit (2-2) is obtained, for example, by reacting a compound selected from the group consisting of a diamine, a bis(aminophenol), a 2,4-diaminophenol, or the like containing X, and a compound selected from the group consisting of tetracarboxylic dianhydride, trimellitic anhydride, dicarboxylic acid, dicarboxylic acid dichloride, or a dicarboxylic acid derivative containing Y. In the case of the dicarboxylic acid, an active ester-type dicarboxylic acid derivative previously reacted with 1-hydroxy-1,2,3-benzotriazole or the like may be used in order to increase the reaction yield.

The polyamide resin having the structural unit (2-1) and the structural unit (2-2) has an amino group at the terminal of the resin which is preferably capped as an amide using an acid anhydride containing an aliphatic group or a cyclic compound group having at least one alkenyl group or alkynyl group. The storage stability may be improved in this manner.

As examples of the group originating from such an acid anhydride which includes at least one aliphatic group or a cyclic compound group having at least one alkenyl group or alkynyl group after reacting with an amino group, the groups shown by the following formula (10) or formula (11) can be given. These compounds may be used either individually or in combination of two or more.

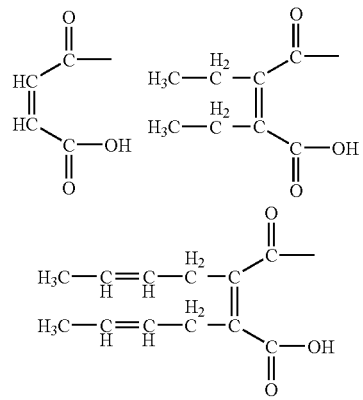

-continued

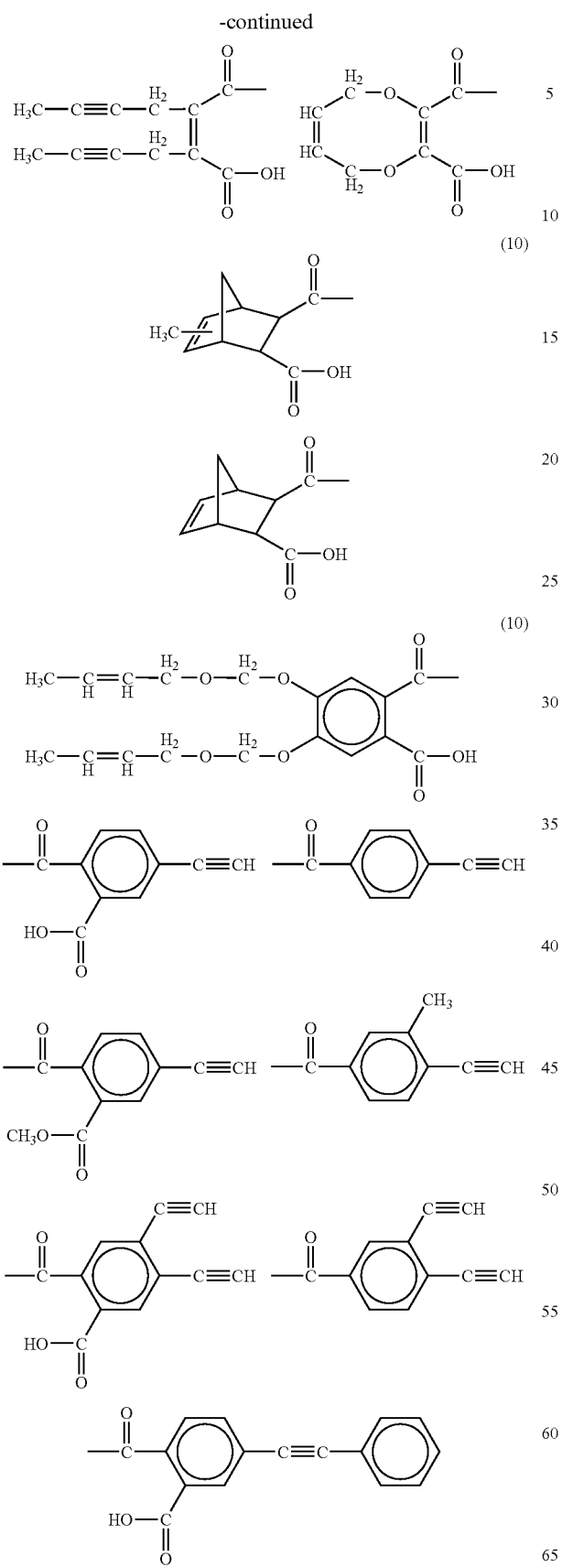

(10)

(10)

-continued

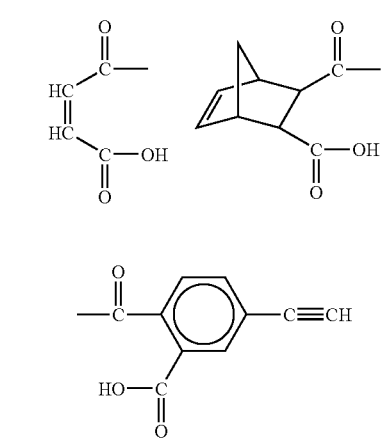

(11)

As preferable examples of the groups shown in the formula (10) and the formula (11), the groups shown by the following formula (12) can be given. The storage stability may be particularly improved by using these groups.

(12)

(12)

The structure of the polyamide resin having the structural unit (2-1) and the structural unit (2-2) is not necessarily limited to these. The acid at the terminal of such a polyamide resin may be capped as an amide using an amine derivative containing an aliphatic group or a cyclic compound group which has at least one alkenyl group or alkynyl group.

To ensure the mechanical characteristic and moisture resistance reliability, the ratio of the amount of the polyamide resin having the structural unit (2-1) and the structural unit (2-2) to the total amount of the alkali-soluble resin (A) contained in the positive-type photosensitive resin composition is preferably 30 to 100 wt %, and particularly preferably 50 to 100 wt %.

As examples of the photosensitive diazoquinone compound (B) used in the positive-type photosensitive resin composition of the present invention, esters of a phenolic compound and 1,2-naphthoquinone-2-diazido-5-sulfonic acid or 1,2-naphthoquinone-2-diazido-4-sulfonic acid can be given. As specific examples, ester compounds shown by the following formulas (13) to (16) can be given. These compounds may be used either individually or in combination of two or more.

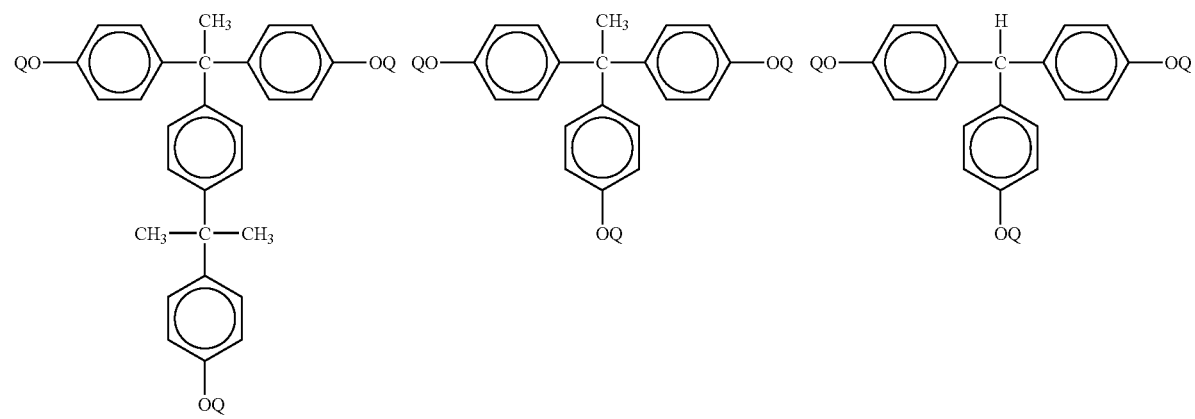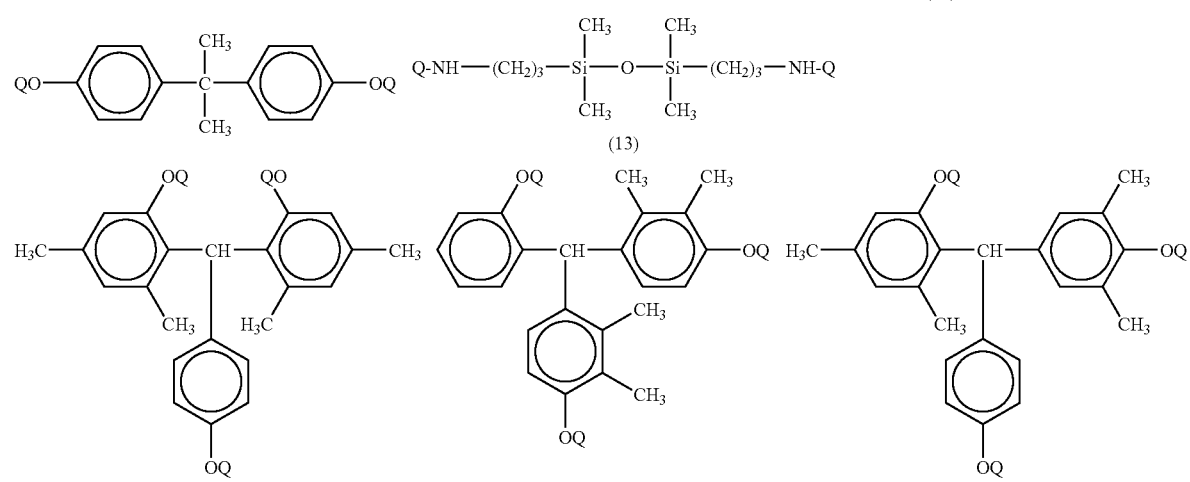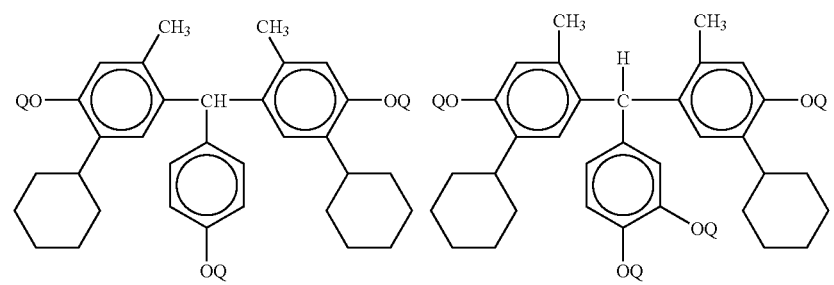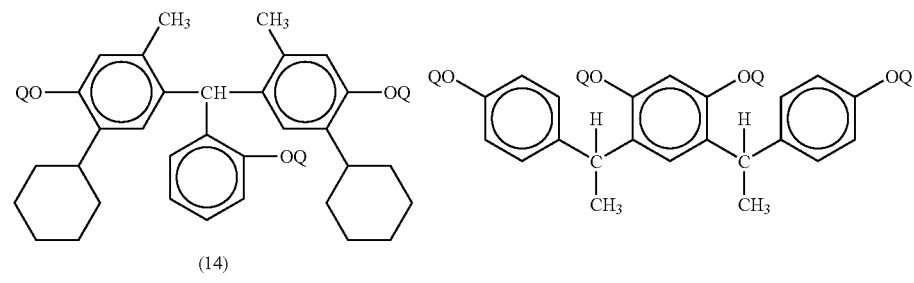

-continued
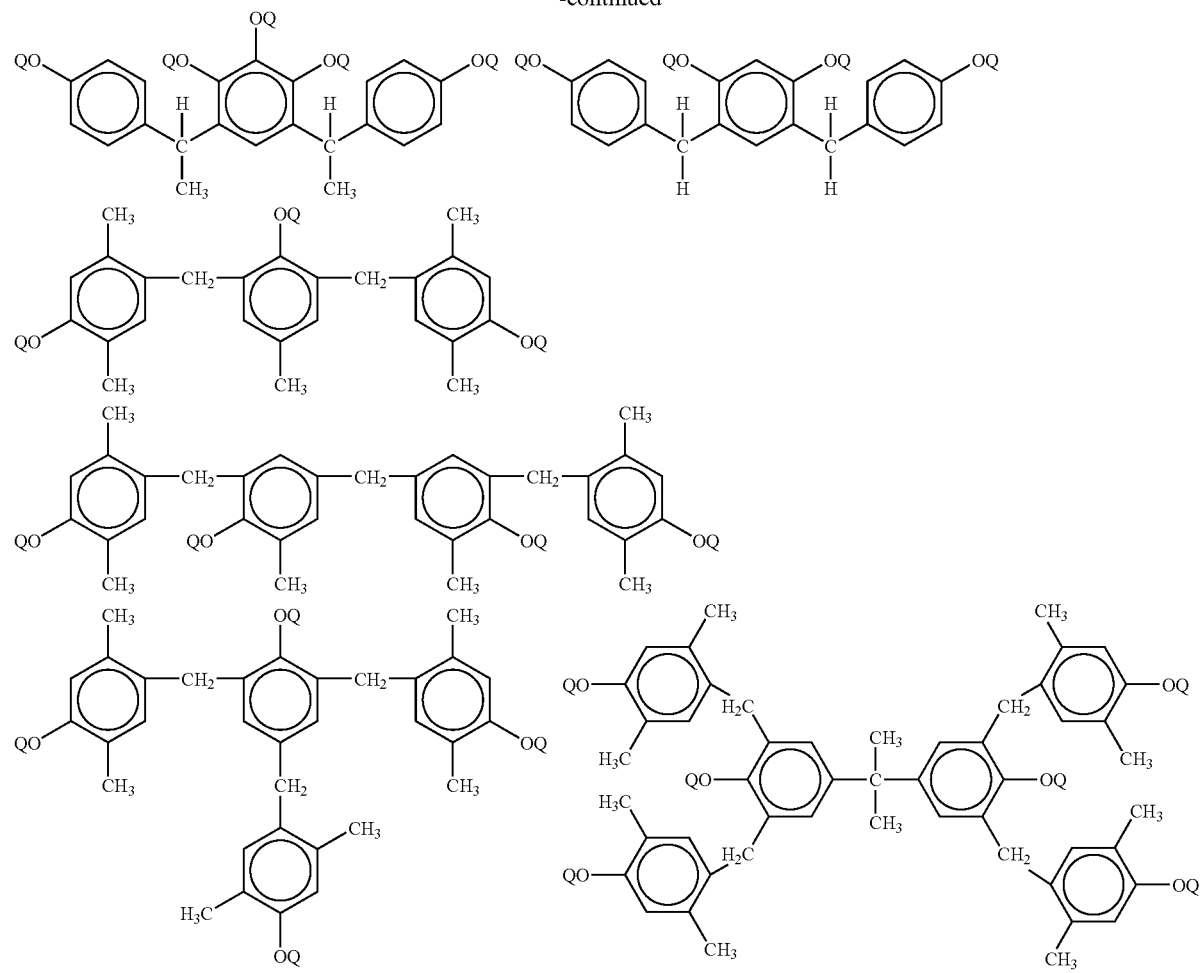
(15)
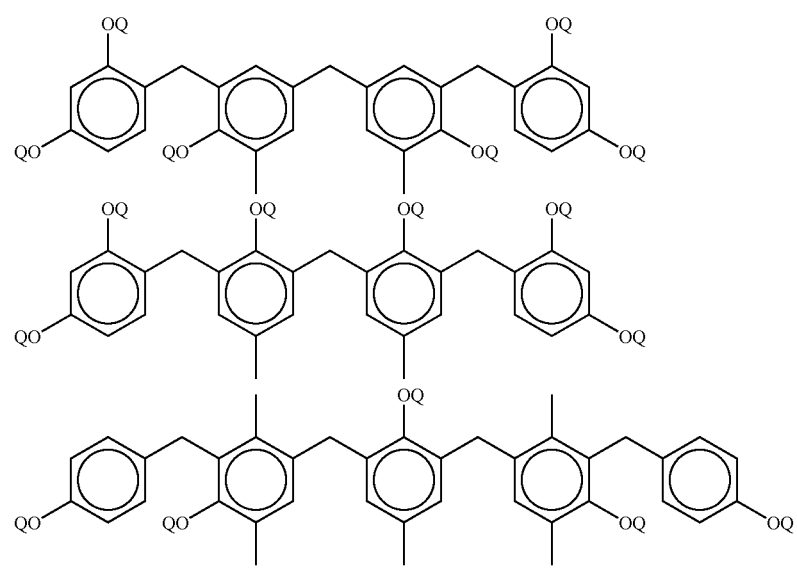
(15)
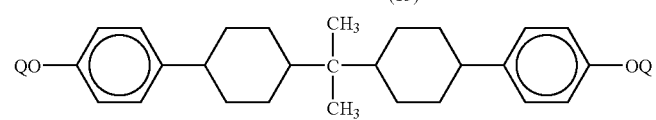

-continued
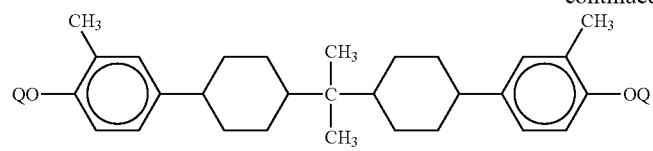
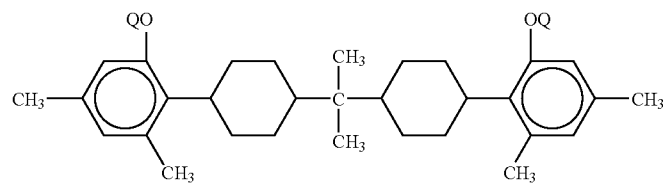
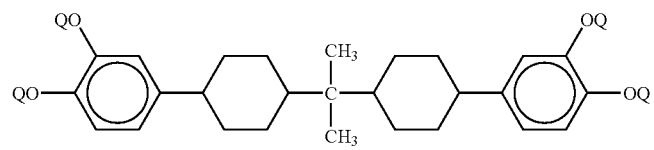
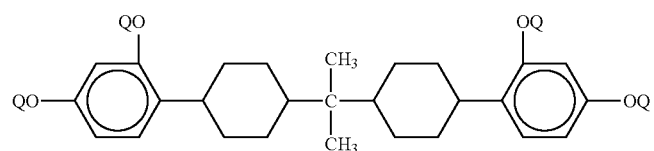
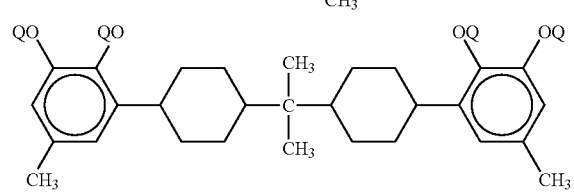
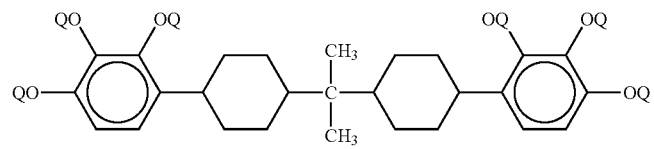
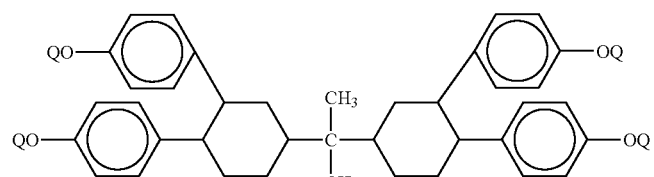
(16)
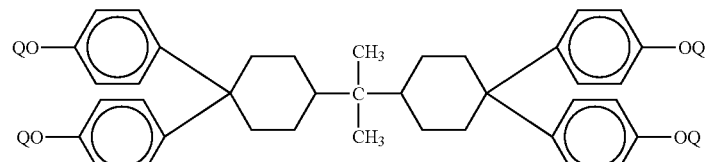
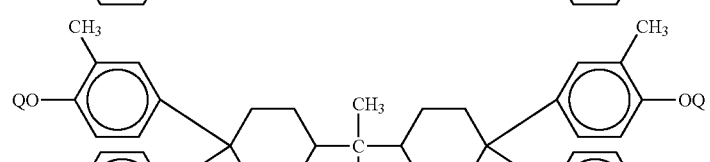
(16)

In the formulas (13) to (16), Q is a hydrogen atom, a group shown by the following formula (17), or a group shown by the following formula (18). The Qs in a compound may be either the same or different. At least one of the Qs in these compounds is the group shown by the formula (17) or the group shown by the formula (18).

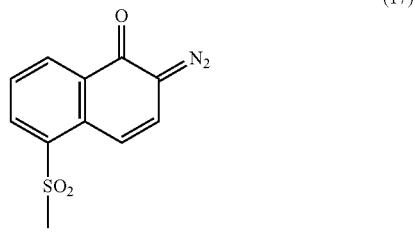

(17)

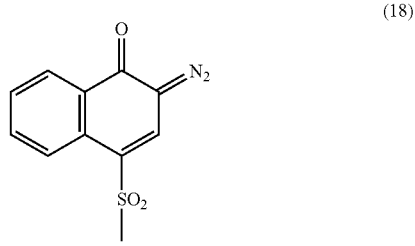

(18)

The amount of the photosensitive diazoquinone compound (B) in the positive-type photosensitive resin composition of the present invention is preferably 1 to 50 parts by weight, and particularly preferably 10 to 40 parts by weight for 100 parts by weight of the alkali-soluble resin (A). The amount of the photosensitive diazoquinone compound (B) in the above range ensures high sensitivity of the positive-type photosensitive resin composition.

The positive-type photosensitive resin composition of the present invention comprises a silicon compound (C-1) shown by the following formula (1),

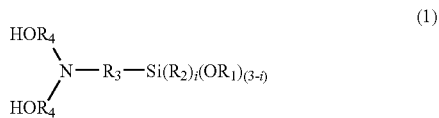

(1)

wherein $R_1$ and $R_2$ represent an alkyl group having 1 to 10 carbon atoms, $R_3$ represents an organic group, $R_4$ represents an alkylene group having 1 to 10 carbon atoms, and i represents an integer from 0 to 2. In the silicon compound shown by the formula (1), two —$R_4$OH groups bond to a nitrogen atom, —$OR_1$, or —$R_2$ bonds to the silicon atom, and the number of —$OR_1$, groups is 1 to 3.

Due to inclusion of the silicon compound (C-1) shown by the formula (1), the coating of the positive-type photosensitive resin composition of the present invention exhibits increased adhesion to a substrate. For this reason, the coating does not show pattern peeling in the adhesion test according to JIS D0202 after a thermal humidification treatment.

The alkoxy silane group of the silicon compound (C-1) shown by the formula (1) exhibits reactivity with the substrate, whereas the alkylol amino group exhibits reactivity with the alkali-soluble resin (A). This is thought to be the reason for good adhesion of the coating produced from the positive-type photosensitive resin composition to the substrate after the thermal humidification treatment.

Inclusion of the silicon compound (C-1) shown by the formula (1) also increases tensile elongation of the cured film made from the positive-type photosensitive resin composition of the present invention. The elongation is further promoted by increasing the amount of the silicon compound (C-1).

Crosslinking of the alkylol amino group in the silicon compound (C-1) shown by the formula (1) with the alkali-soluble resin (A) is thought to increase the tensile elongation of the cured film.

There are no specific limitations to the alkyl group having 1 to 10 carbon atoms represented by $R_1$ or $R_2$ in the formula (1). Examples include a methyl group, an ethyl group, a propyl group, an isopropyl group, a butyl group, a sec-butyl group, a tert-butyl group, a pentyl group, a hexyl group, a heptyl group, an octyl group, a 2-ethylhexyl group, a nonyl group, a decyl group, an undecyl group, a dodecyl group, a tridecyl group, and a tetradecyl group. Of these, the methyl group and ethyl group are preferable due to their excellent hydrolysis properties. When there are two or more $R_1$s and $R_2$s, the $R_1$s and $R_2$s may be either the same or different.

There are no specific limitations to the organic group represented by $R_3$ in the formula (1). Examples include aliphatic groups such as a methylene group, an ethylene group, a propylene group, an isopropylene group, a butylene group, a tert-butylene group, a pentylene group, a hexylene group, a heptylene group, and an octylene group and aromatic groups such as a phenylene group, a benzylene group, a phenetylene group, a naphthylene group, and a biphenylene group. Of these, the ethylene group and propylene group are preferable due to their excellent solubility in solvents.

There are no specific limitations to the alkylene group having 1 to 10 carbon atoms represented by $R_4$ in the formula (1). Examples include a methylene group, an ethylene group, a propylene group, an isopropylene group, a butylene group, a sec-butylene group, a tert-butylene group, a pentylene group, a hexylene group, a heptylene group, an octylene group, a 2-ethylhexylene group, a nonylene group, and decylene group. Of these, the methylene group and ethylene group are preferable due to their excellent reactivity with the alkali-soluble resin.

i in the formula (1) represents an integer from 0 to 2. i=0 is preferable in view of good adhesion to the substrate.

There are no specific limitations to the silicon compound (C-1) shown by the formula (1). Examples include bis(2-hydroxymethyl)-3-aminomethyltrimethoxysilane, bis(2-hydroxymethyl)-3-aminoethyltrimethoxysilane, bis(2-hydroxymethyl)-3-aminopropyltrimethoxysilane, bis(2-hydroxymethyl)-3-aminophenyltrimethoxysilane, bis(2-hydroxymethyl)-3-aminomethyltriethoxysilane, bis(2-hydroxymethyl)-3-aminoethyltriethoxysilane, bis(2-hydroxymethyl)-3-aminopropyltriethoxysilane, bis(2-hydroxymethyl)-3-aminophenyltriethoxysilane, bis(2-hydroxyethyl)-3-aminomethyltrimethoxysilane, bis(2-hydroxyethyl)-3-aminomethyltrimethoxysilane, bis(2-hydroxyethyl)-3-aminoethyltrimethoxysilane, bis(2-hydroxyethyl)-3-aminopropyltrimethoxysilane, bis(2-hydroxyethyl)-3-aminophenyltrimethoxysilane, bis(2-hydroxyethyl)-3-aminomethyltriethoxysilane, bis(2-hydroxyethyl)-3-aminoethyltriethoxysilane, bis(2-hydroxyethyl)-3-aminopropyltriethoxysilane, and bis(2-hydroxyethyl)-3-aminophenyltriethoxysilane. Of these, in view of excellent adhesion to the substrate and excellent storage stability, bis(2-hydroxymethyl)-3-aminopropyltriethoxysilane, bis(2-hydroxyethyl)-3-aminopropyltriethoxysilane, bis(2-hydroxymethyl)-3-aminopropyltrimethoxysilane, and bis(2-hydroxyethyl)-3-aminopropyltrimethoxysilane are preferable. These silicon compounds may be used either individually or in combination of two or more.

Although not particularly limited, the amount of the organosilicon compound (C-1) shown by the formula (1) in the positive-type photosensitive resin composition of the present invention is preferably 0.05 to 50 parts by weight, and particularly preferably 0.1 to 20 parts by weight for 100 parts by weight of the alkali-soluble resin (A). The content of the organosilicon compound (C-1) shown by the formula (1) in the above range ensures easy compatibility of the adhesion to the substrate and the storage stability of the positive-type photosensitive resin composition.

The positive-type photosensitive resin composition of the present invention may further contain a compound having a phenolic hydroxyl group (D) in order to further improve sensitivity without producing scum during patterning.

As a specific structure of the compound having a phenolic hydroxyl group (D), the structures shown by the following formula (19) can be given. These compounds may be used either individually or in combination of two or more.

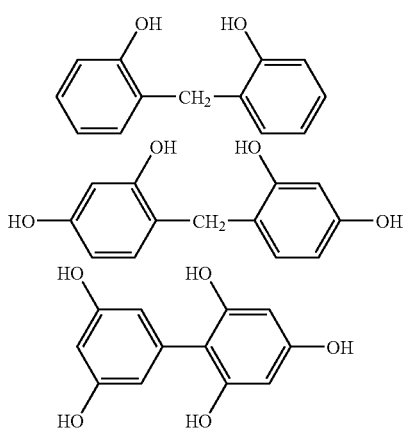

(19)

Although not particularly limited, the compound having a phenolic hydroxyl group (D) is used in an amount of 1 to 30 parts by weight, more preferably 1 to 20 parts by weight for 100 parts by weight of the alkali-soluble resin (A). If the content of the compound having a phenolic hydroxyl group (D) is in the above range, production of scum during development is suppressed and dissolution of the exposed area is promoted, resulting in high sensitivity.

The positive-type photosensitive resin composition of the present invention may further contain additives such as an acrylic-type leveling agent, a silicon-containing leveling agent, a fluorine-containing leveling agent, and a vinyl-type leveling agent, and a silane coupling agent other than the silicon compound (C-1) shown by the formula (1), as required.

Examples of the silane coupling agent other than the silicon compound (C-1) shown by the formula (1) include 3-glycidoxypropyltrimethoxysilane, 3-glycidoxypropylmethyldiethoxysilane, 3-glycidoxypropyltriethoxysilane, p-styryltrimethoxysilane, 3-methacryloxypropylmethyldimethoxysilane, 3-methacryloxypropyltrimethoxysilane, 3-methacryloxypropylmethyldiethoxysilane, 3-methacryloxypropyltriethoxysilane, 3-acryloxypropyltrimethoxysilane, N-2-(aminoethyl)-3-aminopropylmethyldimethoxysilane, N-2-(aminoethyl)-3-aminopropyltrimethoxysilane, N-2-(aminoethyl)-3-aminopropyltriethoxysilane, 3-aminopropyltrimethoxysilane, 3-aminopropyltriethoxysilane, N-phenyl-3-aminopropyltrimethoxysilane, 3-mercaptopropylmethyldimethoxysilane, 3-mercaptopropyltrimethoxysilane, bis(triethoxypropyl) tetrasulfide, 3-isocyanatepropyltriethoxysilane, and silane coupling agents obtained by reacting a silicon compound having an amino group with an acid dianhydride or an acid anhydride.

Although not particularly limited, the examples of the silane compound having an amino group for producing the silane coupling agent other than the silicon compound (C-1) shown by the formula (1) include 3-aminopropyltrimethoxysilane, N-(2-aminoethyl)-3-aminopropyltrimethoxysilane, 3-aminopropylmethyldimethoxysilane, N-(2-aminoethyl)-3-aminopropyltriethoxysilane, and 3-aminopropyltriethoxysilane.

Although not particularly limited, the examples of the acid anhydride for producing the silane coupling agent other than the silicon compound (C-1) shown by the formula (1) include maleic anhydride, chloromaleic anhydride, cyanomaleic anhydride, citoconic acid, and phthalic anhydride. These compounds may be used either individually or in combination of two or more for producing the silane coupling agent other than the silicon compound (C-1) shown by the formula (1).

Although not particularly limited, examples of the acid dianhydride for producing the silane coupling agent other than the silicon compound (C-1) shown by the formula (1) include pyromellitic acid dianhydride, benzene-1,2,3,4-tetracarboxylic acid dianhydride, 3,3',4,4'-benzophenonetetracarboxylic acid dianhydride, 2,3,3',4'-benzophenonetetracarboxylic acid dianhydride, naphthalene-2,3,6,7-tetracarboxylic acid dianhydride, naphthalene-1,2,5,6-tetracarboxylic acid dianhydride, naphthalene-1,2,4,5-tetracarboxylic acid dianhydride, naphthalene-1,4,5,8-tetracarboxylic acid dianhydride, naphthalene-1,2,6,7-tetracarboxylic acid dianhydride, 4,8-dimethyl-1,2,3,5,6,7-hexahydronaphthalene-1,2,5,6-tetracarboxylic acid dianhydride, 4,8-dimethyl-1,2,3,5,6,7-hexahydronaphthalene-2,3,6,7-tetracarboxylic acid dianhydride, 2,6-dichloronaphthalene-1,4,5,8-tetracarboxylic acid dianhydride, 2,7-dichloronaphthalene-1,4,5,8-tetracarboxylic acid dianhydride, 2,3,6,7-tetra-chloronaphthalene-1,4,5,8-tetracarboxylic acid dianhydride, 1,4,5,8-tetra-chloronaphthalene-2,3,6,7-tetracarboxylic acid dianhydride, 3,3',4,4'-diphenyltetracarboxylic acid dianhydride, 2,2',3,3'-diphenyltetracarboxylic acid dianhydride, 2,3,3',4'-diphenyltetracarboxylic acid dianhydride, 3,3',4,4'-p-terphenyl-tetracarboxylic acid dianhydride, 2,2',3,3'-p-terphenyltetracarboxylic acid dianhydride, 2,3,3',4'-p-terphenyltetracarboxylic acid dianhydride, 2,2-bis(2,3-dicarboxyphenyl)-propane dianhydride, 2,2-bis(3,4-dicarboxyphenyl)-propane dianhydride, bis(2,3-dicarboxyphenyl)ether dianhydride, bis(3,4-dicarboxyphenyl)ether dianhydride, bis(2,3-dicarboxyphenyl)methane dianhydride, bis(3,4-dicarboxyphenyl)methane dianhydride, bis(2,3-dicarboxyphenyl)sulfone dianhydride, bis(3,4-dicarboxyphenyl)sulfone dianhydride, 1,1-bis(2,3-dicarboxyphenyl)ethane dianhydride, 1,1-bis(3,4-dicarboxyphenyl)ethane dianhydride, perylene-2,3,8,9-tetracarboxylic acid dianhydride, perylene-3,4,9,10-tetracarboxylic acid dianhydride, perylene-4,5,10,11-tetracarboxylic acid dianhydride, perylene-5,6,11,12-tetracarboxylic acid dianhydride, phenanthrene-1,2,7,8-tetracarboxylic acid dianhydride, phenanthrene-1,2,6,7,8-tetracarboxylic acid dianhydride, phenanthrene-1,2,9,10-tetracarboxylic acid dianhydride, pyrazine-2,3,5,6-tetracarboxylic acid dianhydride, pyrrolidine-2,3,4,5-tetracarboxylic acid dianhydride, thiophene-2,3,4,5-tetracarboxylic acid dianhydride, and 4,4'-hexafluoroisopropylidenediphthalic acid dianhydride. These acid dianhydrides may be used either individually or in combination of two or more.

As examples of the silane coupling agent obtained by reacting a silicon compound having an amino group and an acid anhydride or an acid dianhydride used as the silane coupling agent other than the silicon compound (C-1) shown by the formula (1), a combination of bis(3,4-dicarboxyphenyl)ether dianhydride and 3-aminopropyltriethoxysilane, a combination of 3,3',4,4'-benzophenonetetracarboxylic acid dianhydride and 3-aminopropyltriethoxysilane, a combination of bis(3,4-dicarboxyphenyl)sulfone dianhydride and 3-aminopropyltriethoxysilane, and a combination of maleic anhydride and 3-aminopropyltriethoxysilane can be given because of the compatibility of storage stability of the positive-type photosensitive resin composition and adhesion to a substrate such as a silicon wafer during development or after heat treatment.

The positive-type photosensitive resin composition is dissolved in a solvent and used in the form of a varnish. As examples of the solvent, N-methyl-2-pyrrolidone, γ-butyrolactone, N,N-dimethylacetamide, dimethyl sulfoxide, diethylene glycol dimethyl ether, diethylene glycol diethyl ether, diethylene glycol dibutyl ether, propylene glycol monomethyl ether, dipropylene glycol monomethyl ether, propylene glycol monomethyl ether acetate, methyl lactate, ethyl lactate, butyl lactate, methyl-1,3-butylene glycol acetate, 1,3-butylene glycol-3-monomethyl ether, methyl pyruvate, ethyl pyruvate, methyl-3-methoxypropionate, and the like can be given. These solvents may be used either individually or in combination of two or more.

The method of using the positive-type photosensitive resin composition of the present invention will be described below. The positive-type photosensitive resin composition of the present invention is first applied to an appropriate carrier (substrate) such as a silicon wafer, a ceramic substrate, and an aluminum substrate. When applied to a semiconductor chip, the composition is used in an amount to make a film with a cured thickness of 1.0 to 30 μm after curing. If the thickness is less than the lower limit, it may be difficult for the film to fully exhibit the function as a surface protection membrane of a semiconductor chip. If more than the upper limit, not only it is difficult to obtain a detailed processing pattern, but also processing will take a long time, resulting in a low throughput. As the method of application, spin coating using a spinner, spray coating using a spray coater, immersion, printing, roll coating, and the like can be given. The coated film is then prebaked at 60 to 130° C., dried, and irradiated with actinic rays to form a desired pattern. As the actinic rays, X rays, electron beams, ultraviolet radiation, visible radiation, and the like having a wavelength of 200 to 500 nm may be preferably used.

Next, the irradiated part is dissolved and removed using a developer to obtain a relief pattern. As examples of the developer, an aqueous solution of alkali compounds such as inorganic alkali compounds, for example, sodium hydroxide, potassium hydroxide, sodium carbonate, sodium silicate, sodium metasilicate, and ammonia water; primary amines such as ethylamine and n-propylamine; secondary amines such as diethylamine and di-n-propylamine; tertiary amines such as triethylamine and methyldiethylamine; alcohol amines such as dimethylethanolamine and triethanolamine; quaternary ammonium salts such as tetramethylammonium hydroxide and tetraethylammonium hydroxide; an aqueous solution obtained by adding an appropriate amount of a water-soluble organic solvent such as an alcohol (such as methanol and ethanol) or a surfactant can be preferably used. As the development method, spraying, paddling, immersion, application of supersonic waves, and the like may be used.

Next, the relief pattern formed by development is rinsed. Distilled water is used as a rinse. The resulting product is then treated (cured) with heat to form an oxazole ring, an imide ring, or both of the imide ring and oxazole ring, whereby a cured pattern having excellent heat resistance can be obtained.

The heat treatment is carried out preferably at 180 to 380° C., and more preferably 200 to 350° C. The heat treatment which is carried out here is the above-described heat treatment process.

The cured film of the present invention is a cured product of the positive-type photosensitive resin composition of the present invention. The protecting film of the present invention is the cured film of the present invention. The insulating film of the present invention is the cured film of the present invention. The semiconductor device of the present invention has the cured film of the present invention. The display device of the present invention has the cured film of the present invention.

Next, the cured film of the present invention will be described. The cured film which is a cured product of the positive-type photosensitive resin composition is useful not only for semiconductor devices such as a semiconductor chip, but also for display devices such as a TFT liquid crystal and organic EL, an interlayer dielectric of a multilayered circuit, a cover coat of a flexible copper-clad board, a solder resist film, and a liquid crystal alignment film. As examples of the application to semiconductor devices, a passivation film obtained by forming a cured film of the positive-type photosensitive resin composition on a semiconductor chip, a protecting film such as a buffer coating film obtained by forming a cured film of the positive-type photosensitive resin composition on the passivation film, an insulating film such as an interlayer dielectric obtained by forming a cured film of the positive-type photosensitive resin composition on the circuit formed on the semiconductor chip, an a-ray shielding film, a flattening film, a projection (resin post), a partition, and the like can be given. As examples of the display device, a protecting film obtained by forming a cured film of the positive-type photosensitive resin composition on a display chip, an insulating film or a flattening film for a TFT chip or a color filter, a projection for an MVA-type liquid crystal display and the like, a partition for organic EL chip cathodes and the like can be given. The method of use of the composition for semiconductor devices applies to the method of use for the display devices, that is, a method of forming a patterned layer of the positive-type photosensitive resin composition on a substrate on which a display chip or a color filter is formed may be used. High transparency is required particularly for an insulating film or a flattening film of display devices. A resin layer with such excellent transparency can be obtained by introducing a post exposure process before curing the layer of the positive-type photosensitive resin composition. Introduction of such a post exposure process is more preferable in practice. (2/4)

EXAMPLES

The present invention will be described in detail below.

Example 1

[Synthesis of Alkali-Soluble Resin (A-1)]

A four-neck separable flask equipped with a thermometer, a stirrer, a raw material inlet port, and a dry nitrogen gas feed pipe was charged with 443.21 g (0.900 mol) of a dicarboxylic acid derivative (active ester), which was obtained by reacting 0.900 mol of diphenyl ether 4,4'-dicarboxylic acid and 1.800 mol of 1-hydroxy-1,2,3-benzotriazole, and 366.26 g (1.000 mol) of hexafluoro-2,2-bis(3-amino-4-hydroxyphenyl)propane. 3200 g of N-methyl-2-pyrrolidone was added to dissolve the mixture. The mixture was reacted at 75° C. for 12 hours using an oil bath.

Next, 32.8 g (0.200 mol) of 5-norbornene-2,3-dicarboxylic acid anhydride dissolved in 100 g of N-methyl-2-pyrrolidone was added and the mixture was stirred for a further 12 hours to complete the reaction. After filtering, the reaction mixture was poured into a 3:1 (volume ratio) mixture of water and isopropanol to collect a precipitate, which was sufficiently washed with water, and dried under vacuum to obtain the target alkali-soluble resin (A-1).

[Synthesis of Photosensitive Diazoquinone Compound]

A four-neck separable flask equipped with a thermometer, a stirrer, a raw material inlet port, and a dry nitrogen gas feed pipe was charged with 15.82 g (0.025 mol) of a phenol compound shown by the formula (P-1) and 8.40 g (0.083 mol) of triethylamine. 135 g of tetrahydrofuran was added to dissolve the mixture. After cooling the reaction mixture to 10° C. or less, 22.30 g (0.083 mol) of 1,2-naphthoquinone-2-diazido-4-sulfonylchloride was slowly added dropwise together with 100 g of tetrahydrofuran while maintaining the temperature at less than 10° C. After stirring for five minutes at 10° C. or less, the reaction mixture was stirred at room temperature for five hours before terminating the reaction. The reaction mixture was filtered and poured into a 3:1 (volume ratio) mixture of water and methanol. The resulting precipitate collected by filtration was sufficiently washed with water and dried under vacuum to obtain a photosensitive diazoquinone compound shown by the formula (B-1).

[Preparation of Positive-Type Photosensitive Resin Composition]

100 g of the synthesized alkali-soluble resin (A-1), 15 g of the photosensitive diazoquinone compound which has a structure of the formula (B-1), and 10 g of a silicon compound which has a structure of the formula (C-1-1) were dissolved in 150 g of γ-butyrolactone. The solution was filtered through a Teflon (registered trademark) filter with a pore size of 0.2 μm to obtain a positive-type photosensitive resin composition.

[Evaluation of Adhesion after High Temperature and High Humidity Treatment]

The positive-type photosensitive resin composition was applied to a silicon wafer using a spin coater and prebaked on a hot plate at 120° C. for four minutes to obtain a coated film with a thickness of about 8.0 μm.

After prebaking, the film was cured by heating in a clean oven for 30 minutes at 150° C. and 30 minutes at 320° C. in an atmosphere with an oxygen concentration of 1000 ppm or less. The cured film was cross-cut into 100 pieces (1 mm×1 mm squares, 10 lengthwise and 10 crosswise), using an utility knife according to JIS K5400 to obtain a cross-cut sample. The sample was treated (high temperature and high humidity treatment.) in a pressure cooker at 125° C. and 100% RH under 0.2 MPa continuously for 24 hours to evaluate adhesion according to JIS D0202. As a result, it was confirmed that no square was peeled off. Even one square peeling among 100 in a cross-cut test causes a problem in practice. The test sample was confirmed to have good adhesion after the high temperature and high humidity treatment.

[Measurement of Tensile Elongation of Cured Film]

The positive-type photosensitive resin composition was applied to a 6-inch silicon wafer in an amount to make a film with thickness of about 10.0 μm after curing. The applied composition was prebaked on a hot plate at 120° C. for four minutes. After prebaking, the film was cured by heating in a clean oven for 30 minutes at 150° C. and 30 minutes at 320° C. in an atmosphere with an oxygen concentration of 1000 ppm. A wafer with the cured film thereon was cut into 10 mm strips using a dicing saw and immersed in a 2% HF (hydrofluoric acid) aqueous solution to peel the film from the wafer. The peeled film was dried in a dryer at 60° C. for eight hours.

The tensile elongation of the peeled film was measured using a tensile tester to find that the tensile elongation was 45%.

Example 2

A positive-type photosensitive resin composition was prepared and evaluated in the same manner as in Example 1 except that the amount of the silicon compound having a structure of the formula (C-1-1) was reduced from 10 g to 1 g.

Comparative Example 1

A positive-type photosensitive resin composition was prepared and evaluated in the same manner as in Example 1 except that 10 g of a silicon compound having a structure of the formula (C-2) was added instead of the silicon compound having a structure of the formula (C-1-1).

Comparative Example 2

A positive-type photosensitive resin composition was prepared and evaluated in the same manner as in Example 1 except that 10 g of a silicon compound having a structure of the formula (C-3) was added instead of the silicon compound having a structure of the formula (C-1-1).

Comparative Example 3

A positive-type photosensitive resin composition was prepared and evaluated in the same manner as in Example 1 except that the silicon compound having a structure of the formula (C-1-1) was not added.

Structures of (P-1), (B-1), (C-1-1), (C-2), and (C-3) in Examples and Comparative Examples, and Table 1 are shown below. The amounts of the alkali-soluble resins and silicon compounds are shown on a parts by weight basis.

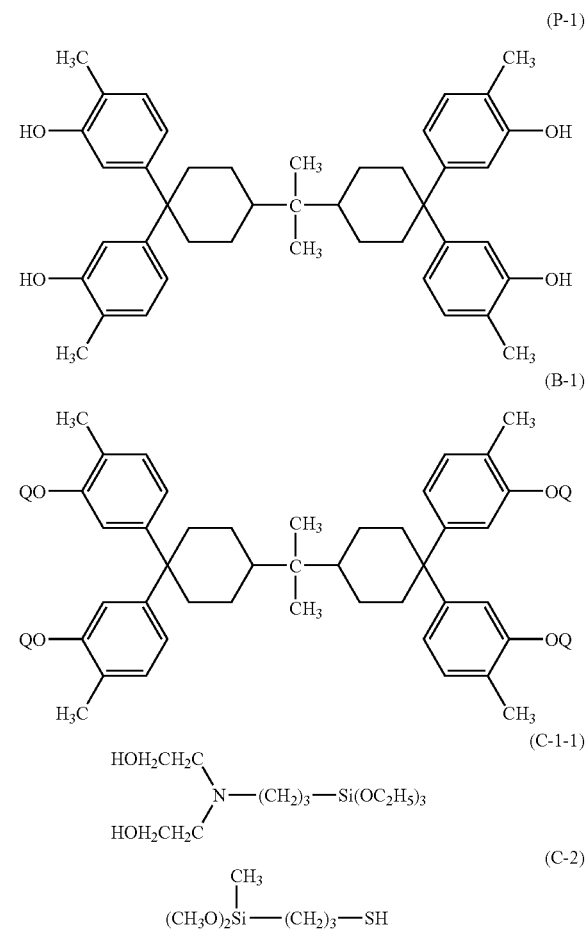

-continued

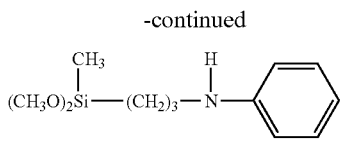
(C-3)

In the above formula (B-1), Q represents a hydrogen atom or a group shown by the following formula (B-1-i) of which the percentage by weight in Q is 85%.

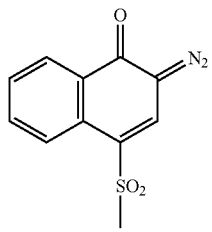
(B-1-i)

2. The positive-type photosensitive resin composition according to claim 1, wherein the alkali-soluble resin (A) comprises a polyamide resin having structural units (2-1) and (2-2) respectively shown by the following formulas (2-1) and (2-2),

(2-1)

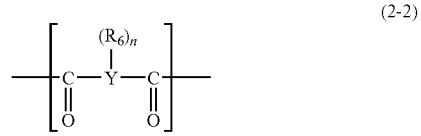
(2-2)

wherein X and Y are organic groups, $R_5$ represents a hydroxyl group, —O—$R_7$—, an alkyl group, an acyloxy group, or a cycloalkyl group, if there are two or more $R_5$s, the $R_5$s may be either the same or different, $R_6$ represents a hydroxyl group, a carboxyl group, —O—$R_7$, or —COO—$R_7$, if there are two or more $R_6$s, the $R_6$s may be either the same or different, m represents an integer from 0 to 8, n represents an integer from

TABLE 1

|  |  | Example 1 | Example 2 | Comparative Example 1 | Comparative Example 2 | Comparative Example 3 |
|---|---|---|---|---|---|---|
| Alkali-soluble resin |  | A-1 | A-1 | A-1 | A-1 | A-1 |
|  |  | 100 | 100 | 100 | 100 | 100 |
| Photosensitive diazoquinone compound |  | B-1 | B-1 | B-1 | B-1 | B-1 |
|  |  | 15 | 15 | 15 | 15 | 15 |
| Silicon compound | Formula (C-1-1) | 10 | 1 |  |  |  |
|  | Formula (C-2) |  |  | 10 |  |  |
|  | Formula (C-3) |  |  |  | 10 |  |
| Adhesion evaluation after thermal humidification | Number of peeled samples/100 | 0/100 | 0/100 | 37/100 | 55/100 | 74/100 |
| Tensile elongation | % | 45 | 25 | 13 | 12 | 12 |

As shown in Table 1, there was no peeling in the adhesion evaluation test after thermal humidification treatment in Examples 1 and 2, indicating good adhesion. The tensile elongation was also confirmed to be excellent.

Since the cured film of the positive-type photosensitive resin composition of the present invention has excellent adhesion to a substrate after high temperature and high humidity treatment., the composition can be suitably used for semiconductor chips, a surface protecting film of display chips, interlayer dielectric, and the like.

What is claimed is:

1. A positive-type photosensitive resin composition comprising (A) an alkali-soluble resin, (B) a photosensitive diazoquinone compound, and (C-1) a silicon compound shown by the following formula (1),

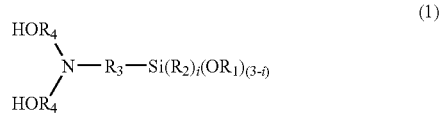
(1)

wherein $R_1$ and $R_2$ represent alkyl groups having 1 to 10 carbon atoms, $R_3$ represents an organic group, $R_4$ represents an alkylene group having 1 to 10 carbon atoms, and i represents an integer from 0 to 2.

0 to 8, and and $R_7$ represents an organic group having 1 to 15 carbon atoms, wherein when two or more $R_5$s are present, the $R_5$s may be either the same or different, when none of the $R_5$s is a hydroxyl group, at least one of the $R_6$s is a carboxyl group, and when none of the $R_6$s is a carboxyl group, at least one of the $R_5$s is a hydroxyl group.

3. The positive-type photosensitive resin composition according to claim 2, wherein X—$(R_5)_m$ in the formula (2-1) is at least one group selected from the groups shown in the following formulas (3),

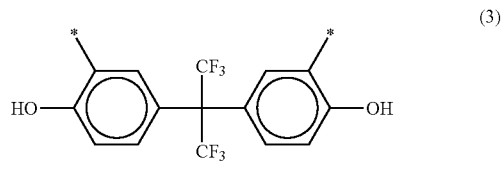
(3)

(3-1)

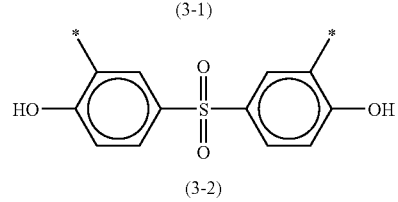
(3-2)

-continued

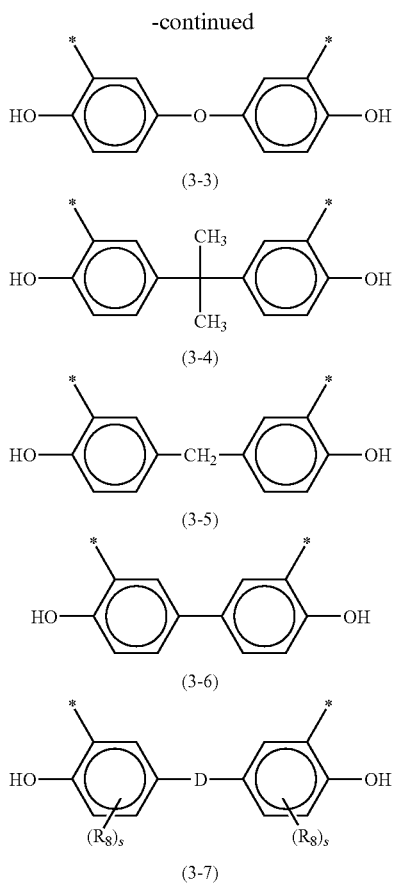

wherein the asterisks (*) bonds —NH group, D in the formula (3-7) is —CH$_2$—, —CH(CH$_3$)—, —C(CH$_3$)$_2$—, —O—, —S—, —SO$_2$—, —CO—, —NHCO—, —C(CF$_3$)$_2$—, or a single bond, R$_8$ in the formula (3-7) represents an alkyl group, an alkoxy group, an acyloxy group or a cycloalkyl group, two or more R$_8$s, if present, being either the same or different, and s represents an integer from 1 to 3, and Y—(R$_6$)$_n$ in the formula (2-2) is at least one group selected from the groups shown in the following formula (4),

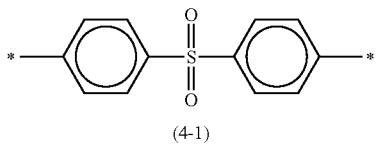

-continued

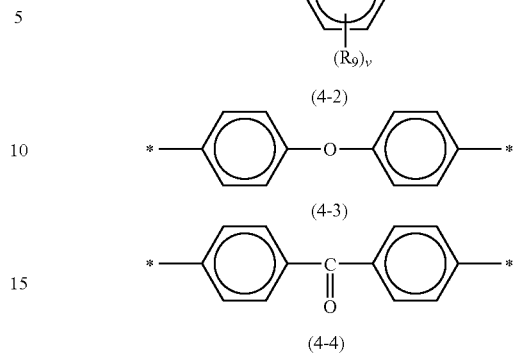

wherein the asterisks (*) bonds —C=O group, in the formula (4-2), R$_9$ represents an alkyl group, an alkyl ester group, an alkyl ether group, a benzyl ether group, or a halogen atom, two or more R$_9$s, if present, being either the same or different, and v represents an integer from 0 to 4.

4. The positive-type photosensitive resin composition according to any one of claims 1 to 3, wherein i in the formula (1) showing the silicon compound (C-1) is 0.

5. The positive-type photosensitive resin composition according to claim 1, wherein R$_1$ in the formula (1) showing the silicon compound (C-1) is a methyl group or an ethyl group.

6. The positive-type photosensitive resin composition according to claim 1, wherein R$_4$ in the formula (1) showing the silicon compound (C-1) is a methylene group or an ethylene group.

7. The positive-type photosensitive resin composition according to claim 1, containing the silicon compound (C-1) shown by the formula (1) in an amount of 0.1 to 20 parts by weight for 100 parts by weight of the alkali-soluble resin (A).

8. A cured film comprising a cured product of the positive-type photosensitive resin composition according to claim 1.

9. A protecting film comprising the cured film according to claim 8.

10. An insulating film comprising the cured film according to claim 8.

11. A semiconductor device comprising the cured film according to claim 8.

12. A display device comprising the cured film according to claim 8.

* * * * *